(12) United States Patent  
Garrity

(10) Patent No.: US 8,487,803 B1  
(45) Date of Patent: Jul. 16, 2013

(54) PIPELINED ANALOG-TO-DIGITAL CONVERTER HAVING REDUCED POWER CONSUMPTION

(75) Inventor: Douglas A. Garrity, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/355,657

(22) Filed: Jan. 23, 2012

(51) Int. Cl.
*H03M 1/38* (2006.01)

(52) U.S. Cl.
USPC ............ 341/161; 341/122; 341/155; 341/162

(58) Field of Classification Search
USPC .......................................... 341/122, 161–162
See application file for complete search history.

(56) References Cited

U.S. PATENT DOCUMENTS

| | | | |
|---|---|---|---|
| 5,574,457 A | 11/1996 | Garrity et al. | |
| 6,362,770 B1 * | 3/2002 | Miller et al. | 341/172 |
| 6,366,230 B1 * | 4/2002 | Zhang et al. | 341/162 |
| 6,801,151 B1 * | 10/2004 | Opris | 341/161 |
| 7,064,700 B1 | 6/2006 | Garrity et al. | |
| 7,652,611 B2 * | 1/2010 | Elliott et al. | 341/161 |

OTHER PUBLICATIONS

Lewis et al.; "A 10-b 20-Msample/s Analog-to-Digital Converter"; IEEE Journal of Solid-State Circuits; Mar. 1992, pp. 351-358; vol. 27, No. 3; IEEE.

* cited by examiner

*Primary Examiner* — Khai M Nguyen
(74) *Attorney, Agent, or Firm* — Jonathan N. Geld

(57) ABSTRACT

A pipelined analog-to-digital converter is provided that has advantages of both a high input sample rate as well as low power consumption due to having all but the first pipeline stage operate at a frequency that is a fraction of the input sample rate. The first stage of the pipelined ADC has an internal operating frequency that is the full ADC sample rate, and samples the input signal on the same clock edge for each sample. Subsequent pipeline stages have parallel input sampling circuitry that samples provided input signals at a reduced rate. Since the input sampling circuitry operates at a reduced frequency, power consumption is reduced by those stages. Further, by virtue of sampling the input signal on the same clock edge for each sample, frequency response image generation issues associated with ADC architectures that sample the input signal on more than one clock edge are avoided.

18 Claims, 5 Drawing Sheets

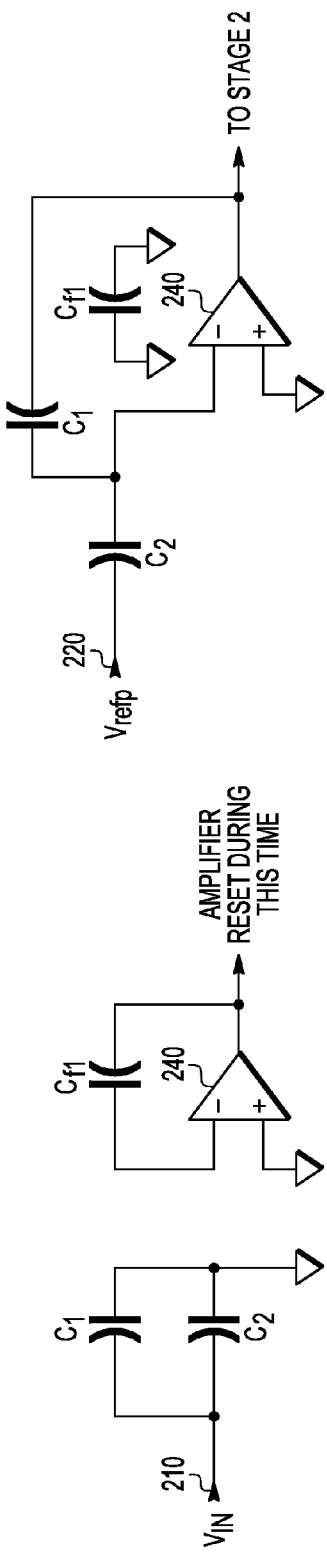
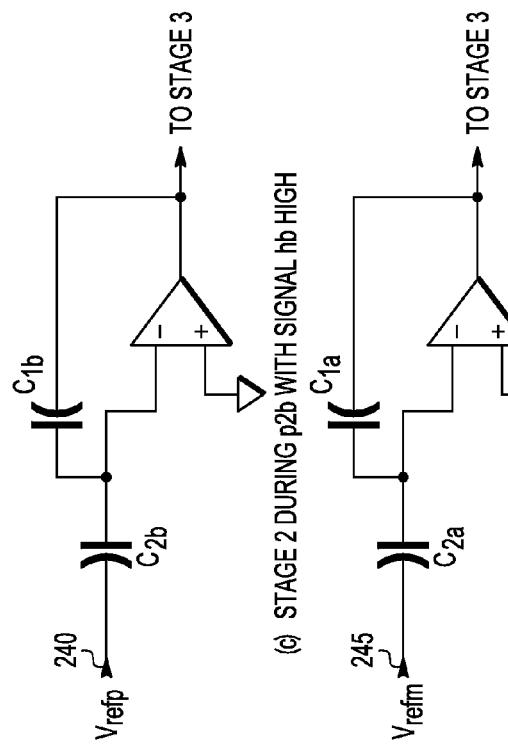
FIG. 4
FIG. 5

PIPELINED ANALOG-TO-DIGITAL CONVERTER HAVING REDUCED POWER CONSUMPTION

BACKGROUND

1. Field

This disclosure relates generally to the field of analog-to-digital converters, and more specifically, to a pipelined analog-to-digital converter that provides a high sample rate while also having decreased power usage over other types of pipelined analog-to-digital converters.

2. Related Art

Applications such as digital video, wireless communications, and sensor signal interpretation often require low power and high speed analog-to-digital signal conversion. Pipelined analog-to-digital converters (ADCs) offer a combination of high throughput and small area. Pipelined ADCs are commonly used for medium to high resolution applications that can tolerate latency associated with the pipeline as signals are processed through each pipeline stage.

In order to keep pace with increasing system clock and data rates, a technique of time interleaving an array of parallel ADCs to achieve high throughput has been applied in a variety of applications, including digital storage oscilloscopes. Traditionally, in such parallel ADC pipelines, the input voltage is converted to a digital code at a desired sample rate, while the internal circuitry of each ADC stage processes samples of the input stream at a slower internal frequency (e.g., one-half the sample frequency for two parallel pipelines). This relaxes constraints on the internal circuitry of the ADC pipelined stages.

A drawback of such parallel signal processing is that the parallel pipeline channels sample the input signal on a number of clock edges equal to the number of parallel pipes. In addition there can also be mismatches (gain errors), offsets, and timing inaccuracies between the channels. This can have an effect of generating significant spurs in frequency response of the overall ADC system. Techniques that have been used to correct for these output issues (e.g., calibration and auto-zeroing of the circuits, or design of the clock circuitry) have shown deficiencies at higher input frequencies, or require use of circuitry that consumes power and space without contributing to the conversion process.

It is therefore desirable to have an ADC that provide the high speed and low power benefits of parallel pipelined ADCs, while at the same time avoiding the frequency response problems exhibited by traditional time-interleaved pipeline ADC methods.

BRIEF DESCRIPTION OF THE DRAWINGS

The present invention may be better understood, and its numerous objects, features, and advantages made apparent to those skilled in the art by referencing the accompanying drawings.

FIG. 4 is a simplified circuit diagram illustrating the effective circuit configuration of the first stage of an ADC pipeline during a first clock period of an ADC conversion cycle, in accord with the circuit illustrated in FIG. 2.

FIG. 5 is a simplified circuit diagram illustrating the effective circuit configuration of the second stage of an ADC pipeline during different clock periods, in accord with the circuit illustrated in FIG. 2.

The use of the same reference symbols in different drawings indicates identical items unless otherwise noted. The figures are not necessarily drawn to scale.

DETAILED DESCRIPTION

A pipelined analog-to-digital converter (ADC) is provided that has advantages of both a high input sample rate as well as low power consumption due to having all but the first pipeline stage to operate at a frequency that is a fraction of the input sample rate. The first stage of the pipelined ADC has an internal operating frequency that is the full ADC sample rate, and samples the input signal on the same clock edge for each sample. Subsequent pipeline stages have parallel input sampling circuitry and therefore can sample input signals provided by a preceding stage at a reduced rate. This results in a reduced operating frequency of the input sampling circuitry, which provides reduction in power consumption by those stages. By virtue of sampling the input signal on the same clock edge for each sample, frequency response image generation issues associated with ADC architectures that sample the input signal on more than one clock edge are avoided.

For the sake of brevity, conventional techniques related to switched capacitor-based gain stages, ADC architectures, voltage comparison circuits, digital logic circuits, and other functional aspect of the system (and the individual system operating components) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment. In addition, for ease of discussion the figures illustrate example single-ended implementations, but those skilled in the art can adapt the illustrated techniques for use in differential signaling applications using the provided guidelines without departing from the scope of the present disclosure.

Figure 1:
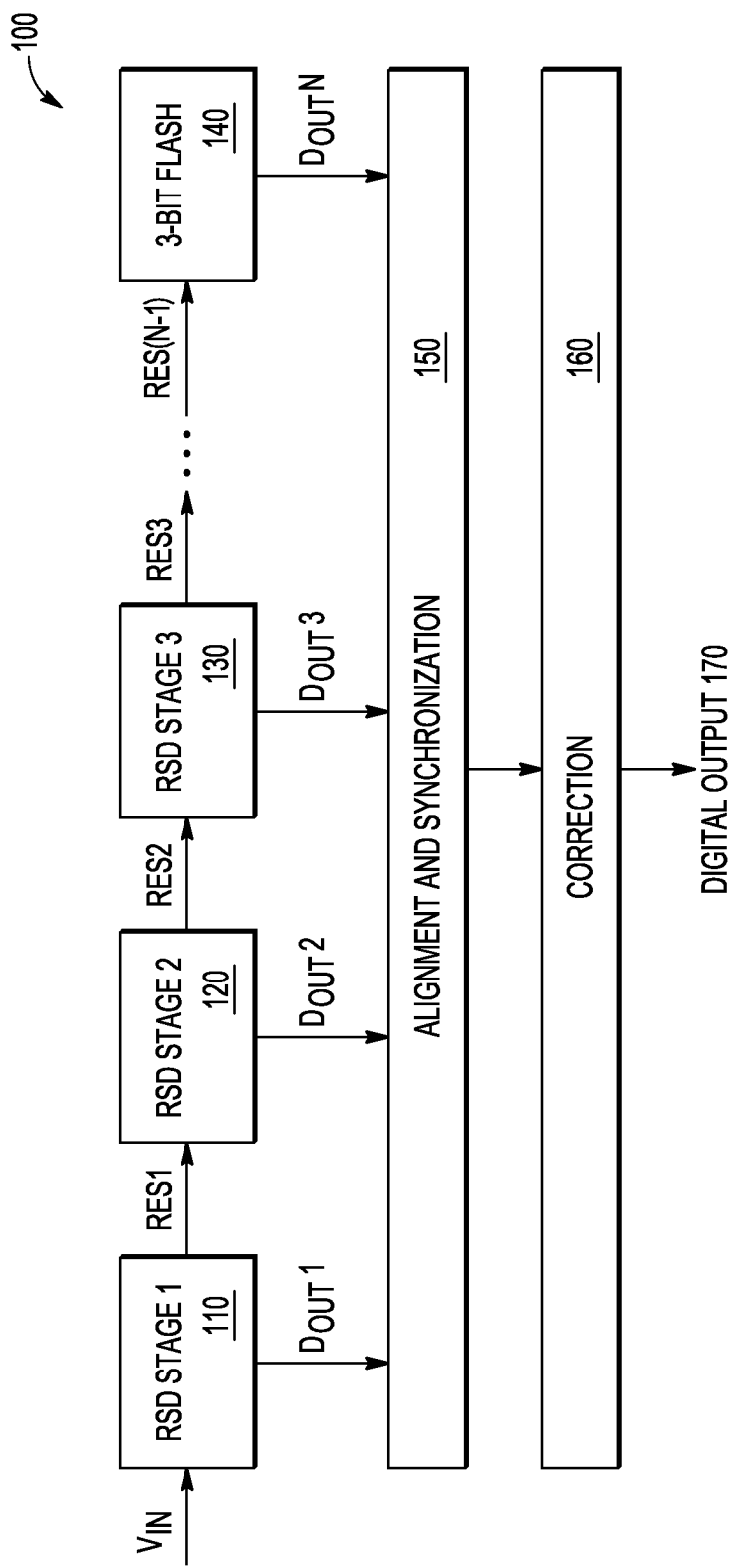
FIG. 1 is a simplified block diagram illustrating a generalized pipelined ADC.

FIG. 1 is a simplified block diagram illustrating a generalized pipelined ADC. As illustrated, ADC 100 includes a plurality of redundant signed digit (RSD) stages 110, 120, and 130, and a multi-bit flash ADC stage 140. Generally, a pipelined ADC 100 samples an analog signal (Vin) at a specified clock rate and generates a digital signal corresponding to a voltage magnitude of each sampled signal. Resolution or accuracy of a pipelined ADC is a function of a number of ADC stages used. Each ADC stage provides at least one bit of resolution, starting with the most significant bit (MSB) for the first stage (110) (e.g., $D_{OUT}1$) and ending with least significant bits from the last stage (140) (e.g., $D_{OUT}N$).

The overall speed of operation of ADC 100 is related to the speed of the series of ADC stages in the pipeline. Each ADC stage relies on the results (e.g., Res1 and Res2) of any preceding ADC stage before generating a digital signal. Typical ADC stages include circuitry that provides, for example, a switched capacitor gain stage and at least one comparator.

The switched capacitor gain stage of an ADC stage amplifies a voltage received by the ADC stage from a coupled adjacent ADC stage.

The comparator of an ADC stage compares the input voltage received by the ADC stage against a reference voltage and generates a corresponding logic level. One example of an ADC stage comparator includes two comparators comparing the input signal against two reference voltage levels, VH and VL. If the input signal is less than VL, the digital output for that stage (e.g., $D_{OUT}1$, $D_{OUT}2$, and the like) is set to −1. If the input signal is greater than VH, the digital output for that stage is set to 1. Otherwise, if the input signal is between VL and VH, the digital output for that stage is set to zero. This comparator configuration, along with the above-discussed switched-capacitor gain stage, is called a 1.5 bit ADC stage. In ADCs having different types of comparators, the stages can provide one or more bits of data. Selection of the number and type of comparators is dependent upon the application.

A residue voltage is also generated to be passed on to the next stage. In the example above, if the input signal is less than VL, the input is multiplied by two (i.e., the input signal is amplified ×2) and a reference voltage is added to provide the residue. If the input signal is greater than VH, the input is multiplied by two and a reference voltage is subtracted to provide the residue. If the input signal is between VL and VH, then the input signal is multiplied by two. The amount of "gaining" of the residue depends upon the application and configuration of the ADC stages (e.g., selection of capacitors in an amplifier portion of the circuitry).

Often in pipelined ADCs, the last stage of the pipeline is a flash ADC that resolves the least significant bits (e.g., 140). The flash ADC stage is a series of comparators with differing threshold voltages used to convert the analog signal to a digital output.

Since the bits from each stage are determined at different points in time as the sample residues pass through the pipeline, all of the bits corresponding to the same sample are time aligned using, for example, shift registers in an alignment and synchronization block 150. The digital representation of the analog input is then passed to digital error correction logic 160. Digital error correction logic 160 is configured to correct for errors generated by comparators at any stage but the last in the pipelined ADC. In addition, logic blocks 150 and 160 can perform other digital processing of the digital output prior to generating digital output 170. Digital output from the pipeline ADC is provided at the sample rate of the ADC, with a delay for processing by each stage of the pipeline.

In a typical pipelined ADC, each ADC stage is clocked at the full ADC sample rate. This requires amplifiers at each stage that can operate at the full frequency corresponding to the full ADC sample rate. Higher ADC operating frequencies consume higher power. Advantages in speed can be realized by using parallel ADCs, but each additional pipeline ADC increases power usage. While lower frequencies could be used in parallel ADC pipelines to achieve the same sampling rate as a single pipeline, power consumption would remain high because each pipeline would be consuming power. Further, the use of parallel stage circuitry requires more circuit area than non-parallel circuitry architectures. Thus, while a four- or eight-channel pipeline could be used, the trade-off in additional circuit area being consumed by the additional channels could be prohibitive in space-conscious applications.

The sampling process used with a multi-channel pipeline can also present image generation issues. Since each channel of the pipeline samples the input signal on a different clock edge, there can be significant frequency response spurs in the output of the pipelined ADC. This is a result of sampling clocking not exactly matching for each channel, as well as component mismatches in the parallel circuits, and the like. One solution to this problem can be to provide a sample and hold circuit prior to the pipeline which can then provide an input voltage to the ADC pipeline that is sampled at well-defined clock intervals. But such a solution utilizes additional circuitry that consumes space and does not provide any calculation advantage to the ADC.

Embodiments of the present invention solve both the frequency response image generation issue and the effective utilization of space issue presented by a multi channel pipeline. The first stage of the pipelined ADC (e.g., RSD stage 110) samples the analog input at the desired full sample rate. The residue from the first stage is then provided to subsequent stages that are configured with circuitry that samples at lower rates by utilizing parallel sampling circuitry, wherein each portion of the parallel sampling circuitry is operating at a defined fraction of the first stage operating frequency.

Figure 2:
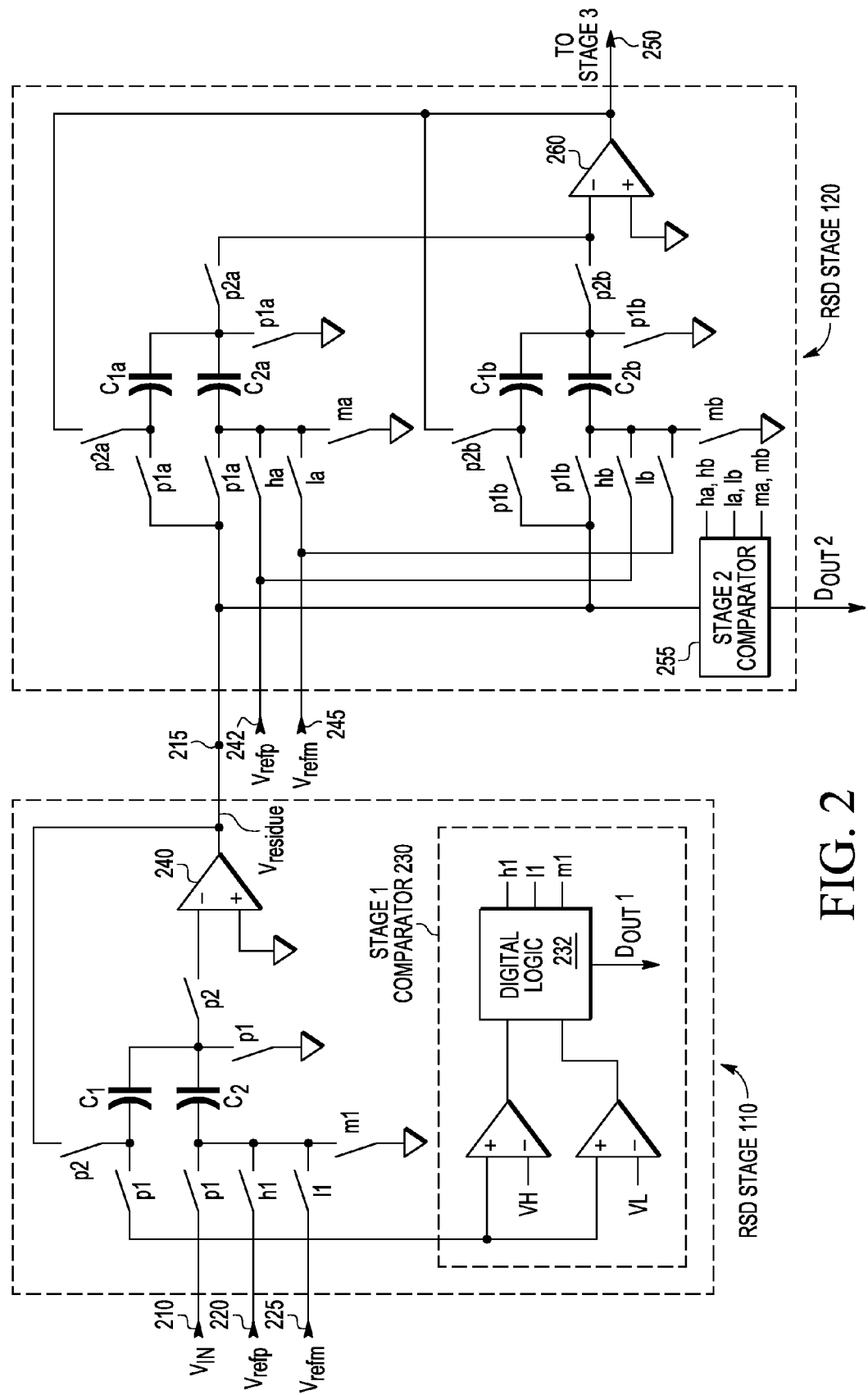
FIG. 2 is a simplified circuit diagram illustrating the first two stages of a pipelined ADC implemented in accord with embodiments of the present invention.
Figure 3:
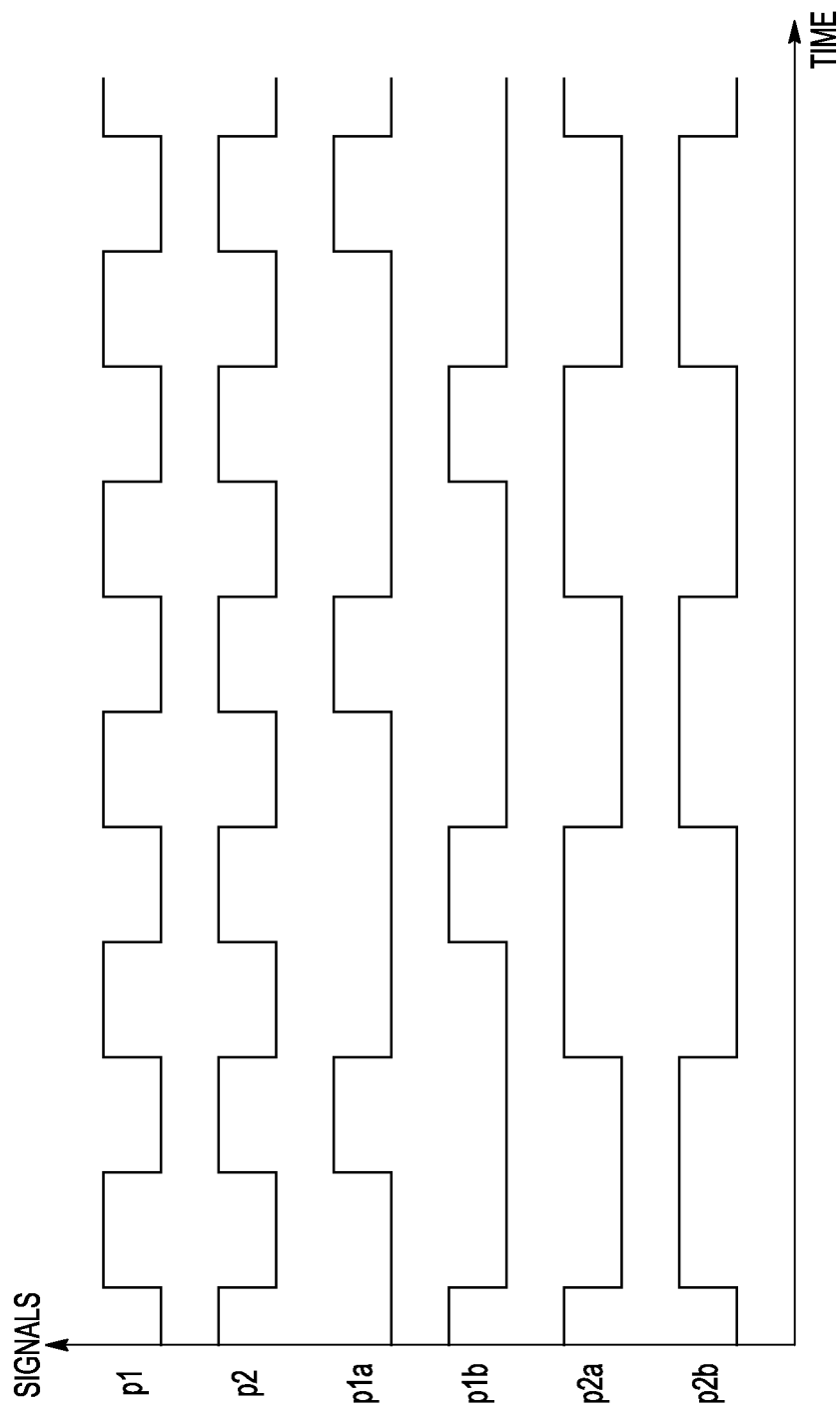
FIG. 3 is a diagram depicting the relative timing of example clock signals that influence the operation of the first two stages of the circuit illustrated in FIG. 2.

FIG. 2 is a simplified circuit diagram illustrating the first two stages of a pipelined ADC (e.g., RSD stages 110 and 120) implemented in accord with embodiments of the present invention. FIG. 3 is a diagram depicting the relative timing of example clock signals that influence the operation of the first two stages.

RSD stage 110 includes an input node 210 for receiving an input voltage signal (Vin) and output node 215 for providing a residue voltage derived from the input voltage signal. RSD stage 110 also includes a first reference node 220 for a first reference voltage Vrefp, and a second reference node 225 for a second reference voltage Vrefm. RSD stage 110 includes a comparator 230 that includes a digital logic component 232 that generates switch control signals (h1, l1, m1) and a digital output $D_{OUT}1$.

Operation of an ADC RSD stage 110 is known to those skilled in the art and, therefore, will not be described in detail. Briefly, the switches in RSD stage 110 are controlled by the clock signals depicted in FIG. 3 and by the switch control signals generated by digital logic component 232. The switches in FIG. 2 are labeled with their respective governing clock/control signals. In this example, when a clock/control signal is high, the associated switch is closed, and when a clock/control signal is low, the associated switch is open. Thus, when the p1 clock signal is high and the p2 clock signal is low, the C1 and C2 capacitors charge to sample the input voltage applied to input node 210. When the p1 clock signal is low and the p2 clock signal is high, the C1 and C2 capacitors are coupled to amplifier 240, which generates an output voltage (Vresidue) at output node 215.

In addition, one of the h1, l1, or m1 switches is closed depending upon the comparison of the input voltage present at input node 210 relative to a high voltage reference (VH) and a low voltage reference (VL). The result of the comparison also determines the data values for digital output $D_{OUT}1$, as discussed above. If the h1 switch is closed during the gain phase, when the p1 clock signal is low and the p2 clock signal is high, then Vrefp is subtracted from the output voltage that would otherwise be generated at output node 215. If the l1 switch is closed during the game phase, then Vrefm is subtracted from the output voltage that would otherwise be generated at output node 215. If the m1 switch is closed during the game phase, then only the C1 and C2 capacitors contribute to the output voltage at output node 215. In a typical ADC application, Vrefp is a positive reference voltage, Vrefm is a negative reference voltage having the same or different absolute magnitude as Vrefp, and the C1 and C2 capacitors have equal capacitance. Under those conditions, the output voltage at output node 215 will be twice the input voltage at input node 210 when the m1 switch is closed, and the output voltage will be modified by the addition or subtraction of Vrefm or Vrefp when the l1 or h1 switches are closed.

FIG. 4 is a simplified circuit diagram illustrating the effective circuit configuration of RSD stage 110 during different clock phases, in accord with the circuit described above. As discussed above, when p1 is high, capacitors C1 and C2 are coupled to input voltage Vin at input node 210 and charge to sample that voltage (FIG. 4(*a*)). Additionally, and not shown in FIG. 2, a capacitor Cf1 can be placed in parallel with amplifier 240 to allow the amplifier to reset during the time when the amplifier is not being used to generate an output voltage. Capacitor Cf1 can be included in the circuit by switches controlled by signal p1. During p2 (FIG. 4(*b*)), capacitor C1 is coupled between the inverting input and the output of amplifier 240, while capacitor C2 is coupled between reference voltage Vrefp and the inverting input of amplifier 240. In addition, capacitor Cf1 is isolated from the amplifier circuit by open switches controlled by p1.

Returning to FIG. 2, RSD stage 120 provides a group of series-coupled switched-capacitor sampling stages. By utilizing more than one switched-capacitor sampling stage, the overall sample frequency of the pipelined ADC can be maintained but with the circuitry of each switched-capacitor sampling stage functioning at a fraction of the overall sample frequency for the RSD stage. As illustrated in FIG. 2, RSD stage 120 provides two switched-capacitor sampling stages, and therefore each switched-capacitor sampling stage uses a shared amplifier 260 that operates at half the overall sample frequency of the ADC. Each switched-capacitor sampling stage is coupled to amplifier 260, which processes the required signals at the overall sample frequency, while operating at half the sample frequency as will become more evident below.

RSD stage 120 has an input signal provided at node 215, which is the residue voltage passed from RSD stage 110. Further, a first reference node 242 is provided for a first reference voltage Vrefp and a second reference node 245 is provided for a second reference voltage Vrefm. Vrefp and Vrefm can be the same as those used in RSD stage 110, or they can be different. If Vrefp and Vrefm were smaller for each subsequent stage, then the amplifier would not swing as much. But separate reference generators for each stage Vrefp and Vrefm would be needed, which requires additional circuitry space, and reducing the amplifier swings can make the amplifier more susceptible to noise, which then requires additional power to lower the noise floor for the amplifier. Thus, it is more practical to utilize the same Vrefp and Vrefm for each stage.

Output node 250 provides a residue voltage derived from the input voltage signal received at node 215. RSD stage 120 also has a comparator logic 255 that includes one or more digital logic components (not shown) that generates switch control signals ha, la, ma, and hb, lb, and mb and a digital output $D_{OUT}2$. As will be discussed in greater detail below, switch control signals (ha, la, ma) are used to control switches in one of the switched-capacitor sampling stages, while switch control signals (hb, lb, mb) are used to control the other of the switched-capacitor sampling stages. Additional sets of switch control signals will be generated for each switched-capacitor sampling stage in a RSD stage. Further, each switched-capacitor sampling stage can have a dedicated comparator logic, at the cost of additional circuit area but with each comparator operating at a lower frequency, or the various switched-capacitor sampling stages can share the same comparator logic (as illustrated).

Operation of RSD stage 120 is familiar to those skilled in the art and, therefore, will not be described in detail. For a detailed example of operation of such an RSD stage, see U.S. Pat. No. 5,574,457, "Switched Capacitor Gain Stage." In brief, switches in RSD stage 120 are controlled by the clock signals depicted in FIG. 3 and by the switch control signals generated by comparator logic 255. The switches are labeled with their respective governing clock/control signals. As with RSD stage 110, when a clock/control signal is high, the associated switch is closed, and when a clock/control signal is low, the associated switches open.

As discussed above, the switched-capacitor sampling stages illustrated in RSD stage 120 operate at different points in the clock cycle. For example, when clock signal p1*a* is high and clock signal p2*a* is low, capacitors C1*a* and C2*a* charge to sample the input voltage applied to input node 215. This is illustrated in FIG. 5(*a*). On the other hand, when clock signal p1*b* is high and clock signal p2*b* is low, capacitors C1*b* and C2*b* charge to sample the input voltage applied to input node 215. This is illustrated in FIG. 5(*b*). As illustrated in FIG. 3, when p1*a* is high, p1*b* is low, and vice versa, so at no time do both switched-capacitor sampling stages sample the input voltage concurrently. Each samples the input voltage at node 215 after RSD stage 110 has provided a most recent residue voltage to node 215 (i.e., when p2 is high) at alternating sample periods.

The switched-capacitor sampling stages provide a signal to amplifier 260 after each switched-capacitor sampling stage charge cycle. For example, when clock signal p2*a* is high and signal la is high, the C1*a* and C2*a* capacitors are coupled to amplifier 260, which generates a voltage at output node 250. This is illustrated in FIG. 5(*d*). As with Stage 110, the control signals ha, la, and ma depend upon the comparison of the input voltage present at input node 215 relative to a high-voltage reference and a low-voltage reference. These reference voltages may or may not be the same as that used for Stage 110 and the result of the comparison determines the data values for digital output $D_{OUT}2$. In another example, when clock signal p2*b* is high and signal hb is high, capacitors C1*b* and C2*b* are coupled to amplifier 260, which generates a corresponding output voltage at output node 250. This is illustrated in FIG. 5(*c*). Control signals hb, lb, and mb depend upon a comparison of the input voltage, as sampled by capacitor C1*b* and C2*b*, relative to the high and low voltage references.

As can be seen in the timing diagram of FIG. 3, the switched-capacitor sampling stage sample timing of RSD stage 120 is tied to the output timing of RSD stage 110. When p2 is high, RSD stage 110 outputs a signal to node 215. Clock signals p1*a* and p1*b*, which control the sampling of each switched-capacitor sampling stage, are timed to each be high for every other high clock of p2, so that p1*a* is high during a first high clock of p2, and p2*a* is high for the next high clock signal of p2, and then p1*a* is high for the following, and so on. The output of RSD stage 120 is controlled by clock signals p2*a* and p2*b*. As can be seen from FIG. 3, p2*a* and p2*b* are configured such that an output residue signal is provided at node 250 at the same frequency as the output frequency of RSD stage 110. This output residue signal is then sampled by subsequent stages.

Figure 6:
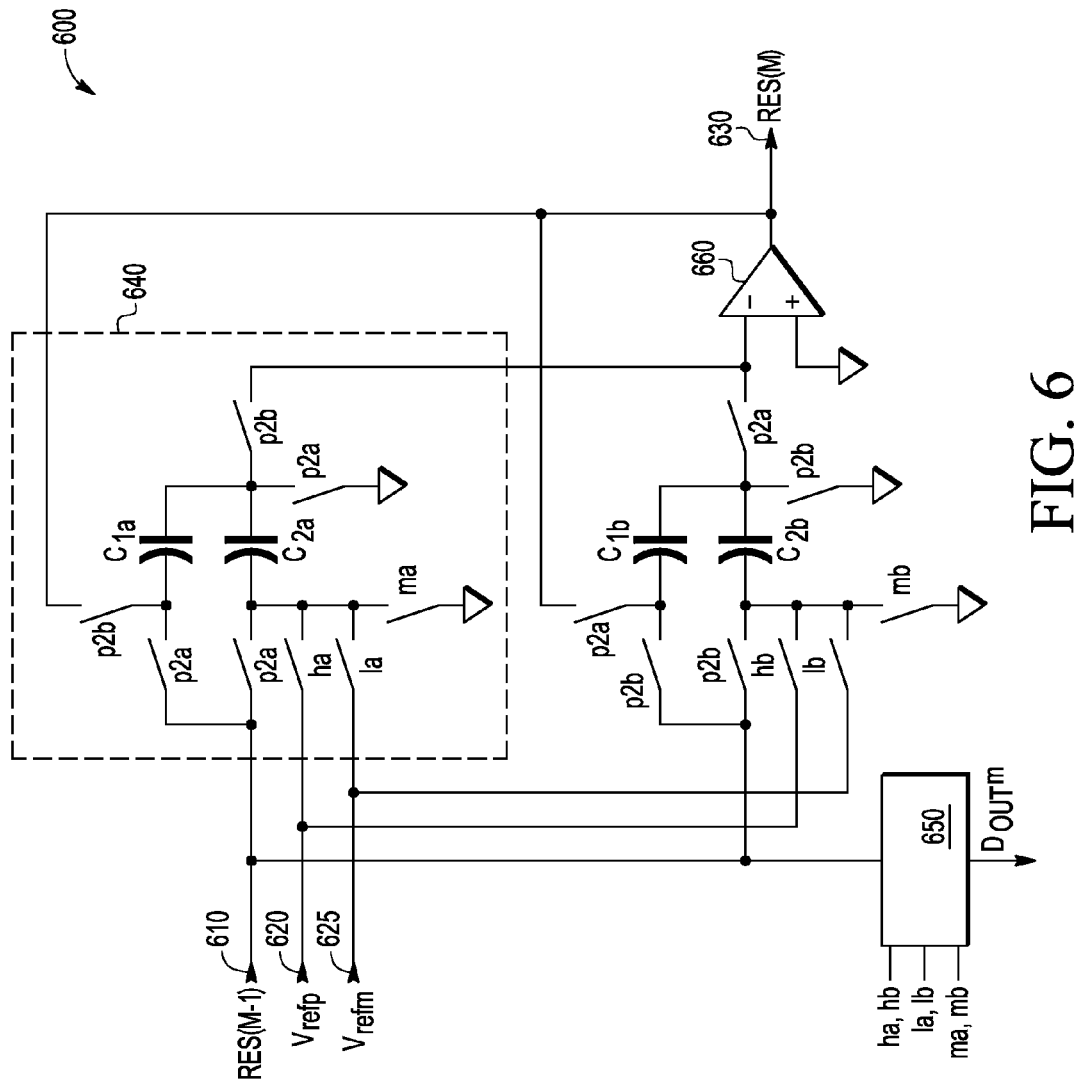
FIG. 6 is a simplified circuit diagram illustrating a stage m of a pipelined ADC, implemented in accord with embodiments of the present invention.

FIG. 6 is a simplified block diagram illustrating a stage m of a pipelined ADC (e.g., RSD Stage 130) implemented in accord with embodiments of the present invention. As illustrated, FIG. 6 provides a stage 600 that includes two switched-capacitor sampling stages (e.g., 640). The switched-capacitor sampling stages are configured similarly to the switched-capacitor sampling stages of RSD Stage 120 described above with regard to FIG. 2. Additional power benefits can be realized by having additional switched-capacitor sampling stages incorporated in ADC stage 600. Effective implementations of ADC stage 600 include a parallel number of sampling stages having a power of two, which also simplifies the clocking of the circuit. By virtue of having x switched-capacitor sampling stages, each switched-capacitor sampling stage has a sampling frequency of 1/x that of the initial stage in the ADC pipeline (i.e., RSD Stage 110). The cost of the lower operating frequency, and associated power savings, is additional circuit space required for each additional switched-capacitor sampling stage 640.

The example timing diagram illustrated in FIG. 3 provides the clock signals p2a and p2b. For RSD stages having more than two switched-capacitor sampling stages, known techniques can be applied to extending the number of clock signals needed to control the switches for each stage. The input voltage signal received by Stage m is the residue voltage signal (Res(m−1)) generated by Stage (m−1) and is received at input node 610. Reference voltages Vrefp and Vrefm are received at nodes 620 and 625, respectively, and are used in the same manner as discussed above with regard to RSD Stage 120 to generate an output voltage (Res(m)) at output node 630, which is passed on to a subsequent stage. As previously discussed, comparator logic 650 generates control signals ha, hb, la, lb, ma, and mb. Comparator logic 650 can include a number of comparators equal to the number of switched-capacitor sampling stages to generate the control signals, depending on the nature of the application. Comparator logic block 650 also generates digital output $D_{OUT}m$, which is provided to the alignment and synchronization logic (e.g., 150).

As discussed above, the final stage of pipelined ADC 100 is a flash ADC stage (e.g., a 3-bit flash) implemented according to techniques known in the art. Such ADC stages can be made with minimal circuitry, and adequately provide the least significant bits for the pipeline.

As discussed above, use of an initial stage of a pipelined ADC that samples on the same clock edge each cycle, as in embodiments of the present invention, provides an advantage of avoiding timing inaccuracies and gain mismatches between multiple channels in a multi-channel pipelined ADC. This reduces or eliminates spurs in the frequency response of the overall ADC pipeline. Benefits of using multi-channel stages in the subsequent pipeline stages of the ADC include an ability to have the internal circuitry of those stages operating at a fraction of the overall sampling frequency of the pipelined ADC, and therefore realizing lower power consumption and lower heat generation by those stages.

By now it should be appreciated that there has been provided a pipelined analog-to-digital converter that includes: (1) a first pipeline ADC stage that receives an analog input signal, samples that analog input signal at a first frequency, and then generates a first residue signal at the first frequency—the first residue signal being responsive to the sampled analog input signal; and, (2) a second pipeline ADC stage that receives the first residue signal from the first pipeline ADC stage and generates a second residue signal at the first frequency. The second pipeline ADC stage includes a first plurality of sample circuits that sample the first residue signal at a second frequency. The first plurality of sample circuits includes N sample circuits, where N is two or more. The second frequency is 1/N times the first frequency. Each of the first plurality of sample circuits samples the first residue signal at a unique sampling time and subsequently generates a corresponding portion of the second residue signal. In one aspect of this embodiment, N is a power of two.

In one aspect of the above embodiment, the pipelined ADC further includes a third pipeline ADC stage that receives the second residue signal from the second pipeline ADC stage and is configured to generate a third residue signal at the first frequency. The third pipeline ADC stage includes a second plurality of sample circuits, each of which samples the second residue signal at a third frequency. The second plurality of sample circuits includes M sample circuits, where M is two or more. The third frequency is then 1/M times the first frequency. Each of the second plurality of sample circuits samples the second residue signal at a unique sampling time and subsequently generates a portion of the third residue signal. In further aspects, M can be equal or not equal to N. In another further aspect, M and N are powers of two.

In another aspect of the above embodiment, the first pipeline ADC stage is further configured to generate a first digital output corresponding to each sample of the analog input signal, and the second pipeline ADC stage further includes comparator logic that generates a second digital output corresponding to each sample of the first residue signal. In a further aspect, the second pipeline ADC stage comparator logic further includes logic circuitry corresponding to each of the first plurality of sample circuits, where the logic circuitry generates one or more control signals configured to control the corresponding sample circuit of the first plurality of sample circuits. In a different further aspect, the second pipeline ADC stage comparator logic further includes logic circuitry coupled to each of the first plurality of sample circuits, where the logic circuitry generates one or more control signals configured to control each sample circuit.

In still another aspect of the above embodiment, the second pipeline ADC stage further includes one amplifier having an input coupled to an output of each of the first plurality of sample circuits and an output that provides the second residue signal.

In another embodiment, a method is provided for converting an analog signal to a digital signal. The method includes having a first pipeline ADC stage perform: sampling the analog signal at a first frequency; generating a first digital output signal responsive to the sampled analog signal; generating a first residue signal at the first frequency, where the first residue signal is responsive to the sampled analog signal. The method further includes having one of a plurality of sample circuits sample the first residue signal at a second frequency, where the plurality of sample circuits includes N sample circuits (N being a power of two and N being two or more), the second frequency is 1/N times the first frequency, and each of the plurality of sample circuits samples a unique portion of the first residue signal. The method further includes having a second pipeline ADC stage perform: generating a second digital output signal responsive to the first residue signal; and generating a second residue signal at the first frequency, where the second residue signal is responsive to the sampled first residue signal and the second pipeline ADC stage also includes the plurality of sample circuits.

One aspect of the above embodiment further includes sampling the second residue signal at a third frequency, generating a third digital output signal responsive to the second residue signal, and generating a third residue signal at the first frequency where the third residue signal is responsive to the sampled second residue signal. Sampling the second residue frequency is performed by one of a second plurality of sample circuits, each of which samples the first residue signal at the third frequency. There are M sample circuits in the second plurality of sample circuits, where M is a power of two and is two or more. The third frequency is thus 1/M times the first frequency. Each of the second plurality of sample circuits samples a unique portion of the second residue signal. Generating the third digital output signal and generating the third residue signal are performed by a third pipeline ADC stage, and the third pipeline ADC stage includes the second plurality of sample circuits. In further aspects, M can be equal to or not equal to N.

Another embodiment of the present invention provides a pipelined ADC that includes: means for sampling an analog signal at a first frequency; means for generating a first digital output signal that is responsive to the sampled analog signal; and, means for generating a first residue signal at the first frequency that is responsive to the sampled analog signal. A first pipeline ADC stage includes the means for sampling the analog signal, the means for generating the first digital output signal, and the means for generating the first residue signal. The embodiment further includes: N means for sampling the first residue signal, where the N means sample the first residue signal at a second frequency; means for generating a second digital output signal responsive to the sampled first residue signal; and means for generating a second residue signal at the first frequency, where the means for generating the second residue signal is responsive to the sampled first residue signal. N is a power of two and N is two or more. The second frequency is 1/N times the first frequency. Each of the N means for sampling the first residue signal samples a unique portion of the first residue signal from each other of the N means for sampling the first residue signal. A second pipeline ADC stage includes the means for generating the second digital output signal, the means for generating the second residue signal, and the N means for sampling the first residue signal.

In one aspect of the above embodiment, the pipelined ADC further includes: M means for sampling the second residue signal, means for generating a third digital output signal responsive to the sampled send residue signal, and means for generating a third residue signal at the first frequency responsive to the sampled second residue signal. The M means for sampling the second residue signal sample the second residue signal at a third frequency. M is a power of two and M is two or more. The third frequency is 1/M times the first frequency. Each of the M means for sampling the second residue signal samples a unique portion of the second residue signal from each other of the M means for sampling the second residue signal. A third pipeline ADC stage includes the M means for sampling the second residue signal, the means for generating the third digital output signal, and the means for generating the third residue signal. In further aspects, M is either equal or not equal to N.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of ADC 100 are circuitry located on a single integrated circuit or within a same device. Alternatively, ADC 100 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the comparators of the various ADC stages can be 1.5 bit (as illustrated), 2 bit, 4 bit, and the like, allowing triggering off of different input voltage amplitudes. The switched-capacitor sampling stages of the ADC stages would likewise be altered to use the control signals thus generated by the comparators. As discussed above, embodiments are also not limited to dual channel ADC stages, and can utilize any number of channels as dictated by space and power consumption concerns. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A pipelined analog-to-digital converter (ADC) comprising:
   a first pipeline ADC stage configured to
     receive an analog input signal,
     sample the analog input signal at a first frequency, generate a first residue signal at the first frequency, wherein the residue signal is responsive to the sampled analog input signal; and a second pipeline ADC stage, coupled to receive the first residue signal from the first pipeline ADC stage, and comprising a first plurality of sample circuits each configured to sample the first residue signal at a second frequency, wherein the first plurality of sample circuits comprises N sample circuits wherein N is two or more, the second frequency is 1/N times the first frequency, each of the first plurality of sample circuits samples a unique portion of the first residue signal from each other of the first plurality of sample circuits, and the second pipeline ADC stage is configured to generate a second residue signal at the first frequency.

2. The pipelined ADC of claim 1 further comprising:
a third pipeline ADC stage, coupled to receive the second residue signal from the second pipeline ADC stage, and comprising a second plurality of sample circuits each configured to sample the second residue signal at a third frequency, wherein the second plurality of sample circuits comprises M sample circuits wherein M is two or more, the third frequency is 1/M times the first frequency, each of the second plurality of sample circuits samples a unique portion of the second residue signal from each other of the second plurality of sample circuits, and the third pipeline ADC stage is configured to generate a third residue signal at the first frequency.

3. The pipelined ADC of claim 2 wherein M is not equal to N.

4. The pipelined ADC of claim 2 wherein M is equal to N.

5. The pipelined ADC of claim 2 wherein M and N are powers of two.

6. The pipelined ADC of claim 1 wherein N is a power of two.

7. The pipelined ADC of claim 1, wherein
the first pipeline ADC stage is further configured to generate a first digital output corresponding to each sample of the analog input signal, and
the second pipeline ADC stage further comprises comparator logic configured to generate a second digital output corresponding to each sample of the first residue signal.

8. The pipelined ADC of claim 7 wherein the second pipeline ADC stage comparator further comprises:
logic circuitry corresponding to each of the first plurality of sample circuits, wherein the logic circuitry is configured to generate one or more control signals configured to control the corresponding sample circuit.

9. The pipelined ADC of claim 7 wherein the second pipeline ADC stage comparator logic further comprises:
logic circuitry coupled to each of the first plurality of sample circuits, wherein the logic circuitry is configured to generate one or more control signals configured to control each sample circuit.

10. The pipelined ADC of claim 1 wherein the second pipeline ADC stage further comprises:
one amplifier having an input coupled to an output of each of the first plurality of sample circuits and an output configured to provide the second residue signal.

11. A method for converting an analog signal to a digital signal, the method comprising:
sampling the analog signal at a first frequency;

generating a first digital output signal responsive to the sampled analog signal;

generating a first residue signal at the first frequency, wherein the first residue signal is responsive to the sampled analog signal, wherein said sampling the analog signal, said generating the first digital output signal, and said generating the first residue signal are performed by a first pipeline analog-to-digital converter (ADC) stage;

sampling the first residue signal at a second frequency, wherein said sampling the first residue signal is performed by one of a plurality of sample circuits each configured to sample the first residue signal at the second frequency, the plurality of sample circuits comprises N sample circuits wherein N is a power of two and is two or more, the second frequency is 1/N times the first frequency, and each of the plurality of sample circuits samples a unique portion of the first residue signal from each other of the plurality of sample circuits;

generating a second digital output signal responsive to the sampled first residue signal; and generating a second residue signal at the first frequency, wherein the second residue signal is responsive to the sampled first residue signal, said generating the second digital output signal and said generating the second residue signal are performed by a second pipeline ADC stage, and the second pipeline ADC stage comprises the plurality of sample circuits.

12. The method of claim 11 further comprising:
sampling the second residue signal at a third frequency, wherein said sampling the second residue signal is performed by one of a second plurality of sample circuits each configured to sample the first residue signal at the third frequency, the second plurality of sample circuits comprises M sample circuits wherein M is a power of two and is two or more, the third frequency is 1/M times the first frequency, and each of the second plurality of sample circuits samples a unique portion of the second residue signal from each other of the second plurality of sample circuits;

generating a third digital output signal responsive to the sampled second residue signal; and generating a third residue signal at the first frequency, wherein the third residue signal is responsive to the sampled second residue signal, wherein said generating the third digital output signal and said generating the third residue signal are performed by a third pipeline ADC stage, and the third pipeline ADC stage comprises the second plurality of sample circuits.

13. The pipelined ADC of claim 12 wherein M is not equal to N.

14. The pipelined ADC of claim 12 wherein M is equal to N.

15. A pipelined analog-to-digital converter (ADC) comprising:
means for sampling an analog signal at a first frequency;
means for generating a first digital output signal, wherein the means for generating the first digital output signal is responsive to the sampled analog signal;

means for generating a first residue signal at the first frequency, wherein
- the means for generating the first residue signal is responsive to the sampled analog signal, and
- a first pipeline analog-to-digital converter (ADC) stage comprises the means for sampling the analog signal, the means for generating the first digital output signal, and the means for generating the first residue signal;

N means for sampling the first residue signal, wherein
- each of the N means for sampling the first residue signal are configured to sample the first residue signal at a second frequency,
- N is a power of two and is two or more,
- the second frequency is 1/N times the first frequency, and
- each of the N means for sampling the first residue signal samples a unique portion of the first residue signal from each other of the N means for sampling the first residue signal;

means for generating a second digital output signal, wherein the means for generating the second digital output signal is responsive to the sampled first residue signal; and means for generating a second residue signal at the first frequency, wherein
- the means for generating the second residue signal is responsive to the sampled first residue signal, and
- a second pipeline ADC stage comprises the means for generating the second digital output signal, the means for generating the second residue signal, and the N means for sampling the first residue signal.

16. The pipelined ADC of claim 15 further comprising:

M means for sampling the second residue signal, wherein
- each of the M means for sampling the second residue signal are configured to sample the second residue signal at a third frequency,
- M is a power of two and is two or more,
- the third frequency is 1/M times the first frequency, and
- each of the M means for sampling the second residue signal samples a unique portion of the second residue signal from each other of the M means for sampling the second residue signal;

means for generating a third digital output signal, wherein
- the means for generating the third digital output signal is responsive to the sampled second residue signal; and means for generating a third residue signal at the first frequency, wherein
- the means for generating the third residue signal is responsive to the sampled second residue signal, and
- a third pipeline ADC stage comprises the M means for sampling the second residue signal, the means for generating the third digital output signal, and the means for generating the third residue signal.

17. The pipelined ADC of claim 16 wherein M is not equal to N.

18. The pipelined ADC of claim 16 wherein M is equal to N.

* * * * *